(12) United States Patent
Yu et al.

(10) Patent No.: US 12,628,376 B2
(45) Date of Patent: May 12, 2026

(54) NANOSHEET STRUCTURES WITH TUNABLE CHANNELS AND INNER SIDEWALL SPACERS

(71) Applicant: GlobalFoundries U.S. Inc., Malta, NY (US)

(72) Inventors: Hong Yu, Clifton Park, NY (US); David C. Pritchard, Glenville, NY (US); Navneet K. Jain, Milpitas, CA (US); James P. Mazza, Saratoga Springs, NY (US); Romain H. A. Feuillette, Williston, VT (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 438 days.

(21) Appl. No.: 18/199,054

(22) Filed: May 18, 2023

(65) Prior Publication Data

US 2024/0387668 A1     Nov. 21, 2024

(51) Int. Cl.
*H10D 30/67*     (2025.01)
*H10D 30/43*     (2025.01)
*H10D 62/10*     (2025.01)
*H10D 84/01*     (2026.01)
*H10D 84/83*     (2025.01)

(52) U.S. Cl.
CPC ......... *H10D 30/6735* (2025.01); *H10D 30/43* (2025.01); *H10D 62/121* (2025.01); *H10D 84/0142* (2025.01); *H10D 84/83* (2025.01)

(58) Field of Classification Search
CPC ........... H10D 30/6735; H10D 30/0195; H10D 30/0196; H10D 30/507; H10D 84/0142; H10D 30/43; H10D 84/83
See application file for complete search history.

(56) References Cited

U.S. PATENT DOCUMENTS

| | | | |
|---|---|---|---|
| 10,297,664 B2 | 5/2019 | Xie | |
| 2018/0301531 A1 | 10/2018 | Xie | |
| 2019/0148489 A1* | 5/2019 | Bhuwalka | ............ H10D 30/014 |
| | | | 257/365 |
| 2020/0395446 A1* | 12/2020 | Yi | .......................... B82Y 10/00 |

(Continued)

OTHER PUBLICATIONS

Partial European Search Report and Opinion dated Jul. 8, 2024 in EP Application No. 24153816.4-1211, 15 pages.

(Continued)

*Primary Examiner* — Changhyun Yi
(74) *Attorney, Agent, or Firm* — David Cain; Andrew M. Calderon; Calderon Safran & Wright P.C.

(57)     ABSTRACT

The present disclosure relates to semiconductor structures and, more particularly, to nanosheet transistor structures with tunable channels and inner sidewall spacers and methods of manufacture. The structure includes: a plurality of stacked semiconductor nanosheets over a semiconductor substrate; a plurality of gate structures surrounding individual nanosheets of the plurality of semiconductor nanosheets, with a lower gate structure comprising a length at least equal to a length of each remaining gate structure of the plurality of gate structures; an inner sidewall spacer adjacent each of the plurality of gate structures; and source/drain regions on opposing sides of the plurality of gate structures, separated therefrom by the inner sidewall spacer.

20 Claims, 8 Drawing Sheets

100

(56) References Cited

U.S. PATENT DOCUMENTS

| | | | |
|---|---|---|---|
| 2020/0411641 A1 | 12/2020 | Noh et al. | |
| 2020/0411667 A1 | 12/2020 | Wong et al. | |
| 2022/0020849 A1 | 1/2022 | Yeom et al. | |
| 2022/0037509 A1* | 2/2022 | Huang | H10D 84/013 |
| 2022/0208967 A1 | 6/2022 | Ko et al. | |
| 2023/0051750 A1 | 2/2023 | Jang et al. | |
| 2024/0055428 A1* | 2/2024 | Yu | H10D 30/014 |

OTHER PUBLICATIONS

European Search Report and Opinion dated Aug. 27, 2024 in EP Application No. 24153816.4-1211, 16 pages.

* cited by examiner

NANOSHEET STRUCTURES WITH TUNABLE CHANNELS AND INNER SIDEWALL SPACERS

BACKGROUND

The present disclosure relates to semiconductor structures and, more particularly, to nanosheet transistor structures with tunable channels and inner sidewall spacers and methods of manufacture.

Gate-All-Around (GAA) nanosheet field effect transistors (FETs) include stacks of nanosheets or nanowires with spacers that are surrounding the full perimeter of multiple nanosheet channel regions with a metal gate stack. Nanosheet transistors have increased performance over planar transistors by providing increased device density and performance.

Nanosheet FETs are prone to a tapered profiling resulting in narrower (e.g., shorter) nanosheets with thicker inner sidewall spacers at the topmost nanosheet (the nanosheet closest to the top metal gate) and wider (e.g., longer) nanosheets with thinner inner sidewall spacers at the bottom nanosheet (the nanosheet closest to the channel of the substrate). Nanosheet FETs exhibit losses in performance at the bottom of the device, e.g., nanosheets nearest the substrate. Thus, the wider nanosheets (nearest the channel) provide lower performance through drivability to the FET. Further, as GAA nanosheet FETs become larger (with more layers), the tapered profiling becomes further exaggerated, with losses in performance becoming greater.

SUMMARY

In an aspect of the disclosure, a structure comprises: a plurality of stacked semiconductor nanosheets over a semiconductor substrate; a plurality of gate structures surrounding individual nanosheets of the plurality of semiconductor nanosheets, with a lower gate structure comprising a length at least equal to a length of each remaining gate structure of the plurality of gate structures; an inner sidewall spacer adjacent each of the plurality of gate structures; and source/drain regions on opposing sides of the plurality of gate structures, separated therefrom by the inner sidewall spacer.

In an aspect of the disclosure, a structure comprises: a plurality of stacked semiconductor nanosheets; a plurality of gate structures surrounding individual nanosheets of the stacked semiconductor nanosheets, the plurality of gate structures comprising an inverse tapered profile; inner sidewall spacers adjacent each of the plurality of gate structures; and source/drain regions on opposing sides of the plurality of gate structures.

In an aspect of the disclosure, a method comprises: forming a plurality of stacked semiconductor nanosheets over a semiconductor substrate; forming a plurality of gate structures surrounding individual nanosheets of the plurality of semiconductor nanosheets, with a lower gate structure comprising a length at least equal to a length of each remaining gate structure of the plurality of gate structures; forming an inner sidewall spacer adjacent each of the plurality of gate structures; and forming source/drain regions on opposing sides of the plurality of gate structures, separated therefrom by the inner sidewall spacer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
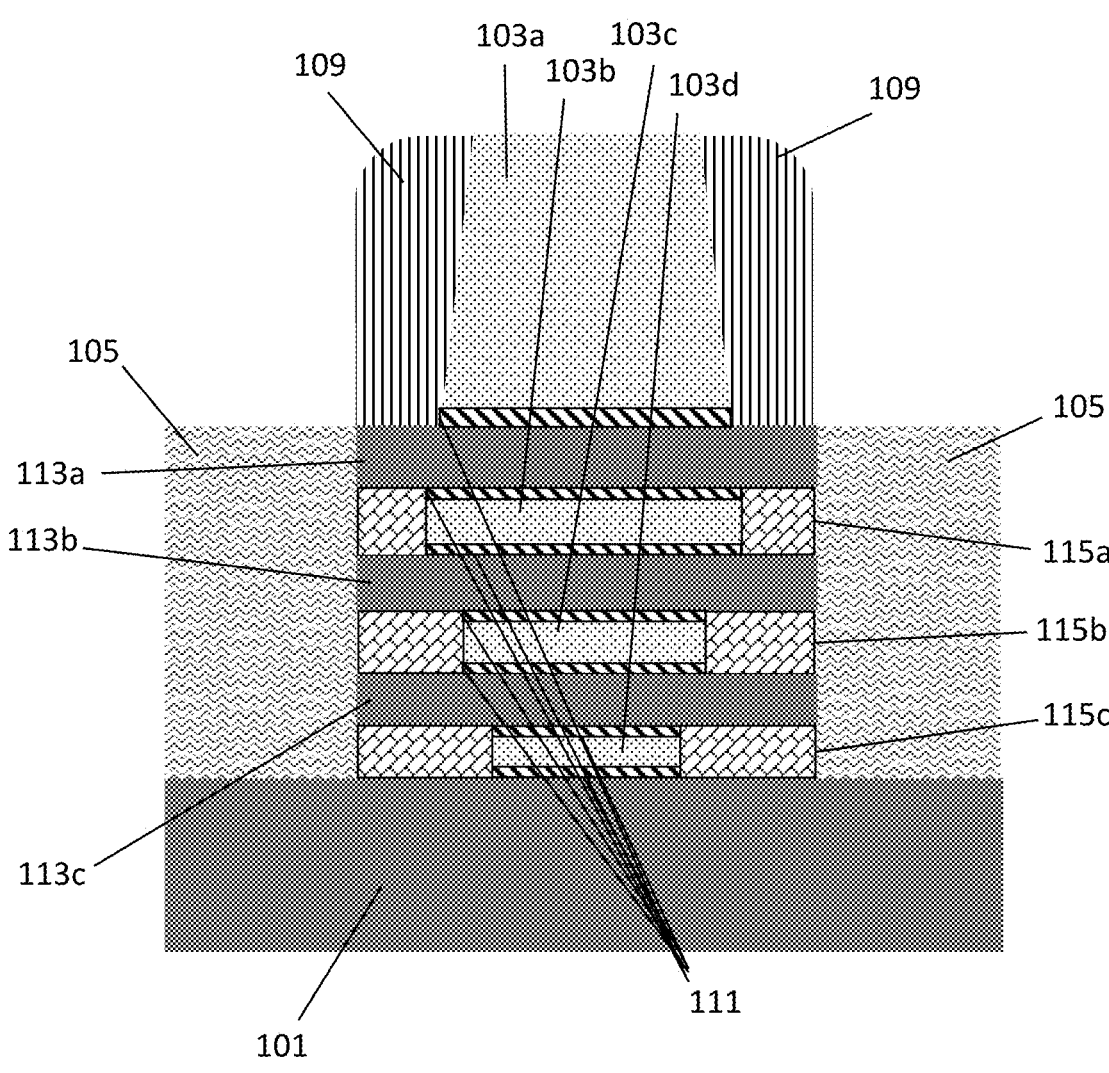
FIG. 1 shows a cross-sectional view of a nanosheet field effect transistor (FET) in accordance with aspects of the present disclosure.

The present disclosure relates to semiconductor structures and, more particularly, to nanosheet field effect transistors (FET). More specifically, the present disclosure comprises gate structures (FETs) wrapped around nanosheets and comprising tunable channels and inner sidewall spacers. For example, in embodiments, the lower gate structure may have the smallest channel length, with the thickest inner sidewall spacer. Alternatively, all of the gate structures, e.g., wraparound gate structures and respective inner sidewall spacers may have uniform gate lengths and thicknesses, respectively. Advantageously, the structures and processes described herein reduce losses in performance, for example, from carrying less current but with the same capacitance.

In more specific embodiments, the processes described provide independently tunable gate structures (e.g., channel lengths) and inner sidewall spacers for the wraparound gate structures. For example, in embodiments, the thicknesses of the inner sidewall spacers and channel length of the gate structures wrapping around the nanosheets can be adjusted at different levels of the structure. For example, the gate length of the gate structures can be tuned to have, e.g., an inverse tapered profile with the lower gate structure being disposed over a semiconductor substrate and having a shorter channel region than upper gate structures (e.g., uppermost and middle gate structures). By providing the ability to adjust the channel length of the gate structures, it is now possible to tune the devices for improved drivability, performance and reliability.

The gate structures can also have other configurations such as a vertically aligned configuration. In this way, the gate length of the lower gate structure may be shorter or comparable to the gate length of the uppermost gate structure, the lower inner spacer may be thicker or comparable to the uppermost inner spacer, and the inner spacer thickness can be independent and tunable. Additionally, the structures and processes allow for increased stack sizes with improved distribution of nanosheets in a GAA nanosheet FET.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

FIG. 1 shows a cross-sectional view of a nanosheet FET in accordance with aspects of the present disclosure. The nanosheet FET 100 of FIG. 1 includes a plurality of stacked nanosheets 113a-113c disposed over a semiconductor substrate 101. In embodiments, the semiconductor substrate 101 and stacked nanosheets 113a-113c may be composed of any suitable semiconductor material including, but not limited to, Si, SiGe, SiGeC, SiC, GE alloys, GaAs, InAs, InP, and other III/V or II/VI compound semiconductors. The semiconductor substrate 101 and stacked nanosheets 113a-113c may also comprise any suitable single crystallographic orientation (e.g., a (100), (110), (111), or (001) crystallographic orientation). Although three nanosheets are shown stacked together with a respective number of wraparound gate structures, it should be understood that more than three nanosheets are contemplated herein, without a loss of performance.

The semiconductor substrate 101 may be a single semiconducting material such as bulk substrate comprising the semiconductor materials described herein. Alternatively, the semiconductor substrate 101 may comprise semiconductor on insulator technology. The semiconductor on insulator technology may include, from bottom to top, a handle wafer, an insulator layer and the semiconductor substrate 101 on top of the insulator layer. The insulator layer may comprise any suitable material, including silicon oxide, sapphire, other suitable insulating materials, and/or combinations thereof. An exemplary insulator layer may be a buried oxide layer (BOX). The insulator layer is formed by any suitable process, such as separation by implantation of oxygen (SIMOX), oxidation, deposition, and/or other suitable processes. The handle wafer may comprise any suitable semiconductor material as already described herein, and may be used as a support for the insulator layer and the semiconductor substrate 101.

Still referring to FIG. 1, gate structure 103a may be provided on an upper nanosheet, with wraparound gate structures 103b, 103c, 103d wrapping around the stacked nanosheets 113a-113c. The lower gate structure 103d may be provided over the semiconductor substrate 101. The gate structures 103a, 103b, 103c, 103d may be metal gate structures composed of appropriate workfunction metals as described herein. As shown, the lower gate structure 103d has a shorter gate channel than the upper wraparound gate structures 103b and 103c. In this way, the wraparound gate structures 103b, 103c, 103d are provided in an inverse taper, with the shortest gate length being on the bottom and the largest gate length being at a top of the stacked structure.

The gate structures 103a, 103b, 103c, 103d include gate dielectric material 111 surrounding each of the stacked nanosheets 113a-113c and over the semiconductor substrate 101. The gate dielectric material 111 may be high-k dielectric material provided on a surface of the semiconductor substrate 101 and which wraps around each of the nanosheets 113a-113c. In embodiments, the high-k dielectric material may be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Still referring to FIG. 1, a sidewall spacer 109 surrounds the gate structure 103a and inner sidewall spacers 115a, 115b, 115c surround the respective wraparound gate structures 103b, 103c, 103d. The inner sidewall spacers 115a-115c may be provided between the nanosheets 113a-113c, and the inner sidewall spacer 115c is between the semiconductor substrate 101 and the nanosheet 113c. The sidewall spacer 109 may be SiN, for example. The inner sidewall spacers 115a, 115b, 115c may also be SiN or other low-k dielectric materials such as SiOCN, SiBCN, etc.

Due to the configuration of the gate structures 103a, 103b, 103c, the inner sidewall spacers 115a, 115b, 115c may have different thicknesses. For example, the lower inner sidewall spacer 115c may be thicker than the upper inner sidewall spacers 115a, 115b. It should be understood, though, that the thickness of the inner sidewall spacers 115a, 115b, 115c may be tunable and dependent on the channel lengths of the respective wraparound gate structures 103b, 103c, 103d as shown for example in FIGS. 2 and 3. In each embodiment, the channel length of the lower gate structure 103d may have a shorter gate length than the channel lengths of the upper wraparound gate structures 103b, 103c in order to improve drivability and performance of the GAA structure.

Accordingly, as should be understood from the present disclosure and as further described herein, the thickness of the inner sidewall spacers 115a, 115b, 115c may be independently tunable to different tapered profiles based on the desired design and performance parameters, e.g., the channel lengths of the respective wraparound gate structures 103b, 103c, 103d. For example, the lower inner sidewall spacer 115c may be thicker than both the uppermost inner sidewall spacer 115a and the middle inner sidewall spacer 115b. As such, the thickness of the inner sidewall spacers 115a-115c have an inverse relationship to the channel length of the wraparound gate structures 103b, 103c, 103d, with the lower gate structure 103d having the shortest channel length and the uppermost gate structure 103b having a larger channel length in this embodiment shown in FIG. 1. In alternative embodiments, the bottom inner sidewall spacers 115a, 115b, 115c may each be of equal thickness or the middle spacer 115b may be the thickest.

FIG. 1 further shows raised source/drain regions 105. The raised source/drain regions 105 may be epitaxial semiconductor material, selectively grown from the semiconductor substrate 101 and the stacked nanosheets 113a-113c. In embodiments, the epitaxial semiconductor material may be silicon germanium (SiGe) or SiP, as examples. The raised source/drain regions 105 may be in-situ doped with an appropriate dopant for an NFET device or PFET device as is understood by those of skill in the art such that no further explanation is required for a complete understanding of the present disclosure. Alternatively, the raised source/drain regions 105 may be subjected to an ion implantation process as is known in the art.

Figure 2:
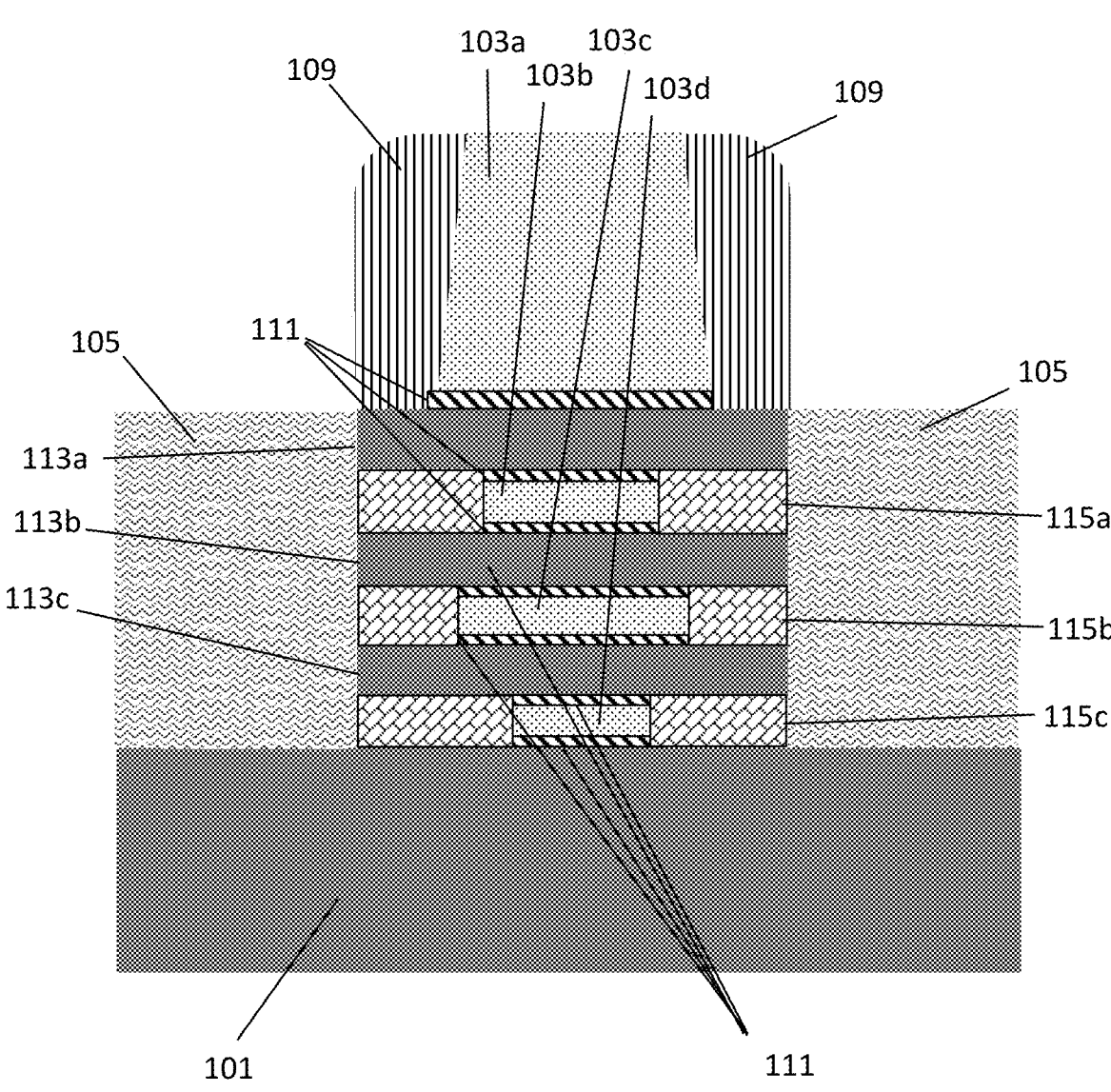
FIG. 2 shows a cross-sectional view of a nanosheet FET in accordance with additional aspects of the present disclosure.

FIG. 2 shows a cross-sectional view of a nanosheet FET in accordance with additional aspects of the present disclosure. In FIG. 2, the FET 200 shows a different configuration of the wraparound gate structures 103b, 103c, 103d and respective inner sidewall spacers 115a, 115b, 115c. For example, in this embodiment, the different thicknesses of the respective inner sidewall spacers 115a, 115b, 115c result in different gate lengths of the wraparound gate structures 103b, 103c, 103d. Illustratively, in the structure 200, the wraparound gate structures 103b, 103c, 103d have a bow shape profile which results in an inverse bow shape structure of the inner sidewall spacers 115a-115c.

In particular, the uppermost inner sidewall spacer 115a may be thinner than the lower inner sidewall spacer 115c and thicker than the middle inner sidewall spacer 115b. On the other hand, the middle inner sidewall spacer 115b may be thinner than both the inner sidewall spacers 115a and 115c, and the lower inner sidewall spacer 115c may be the thickest inner sidewall spacer. In this way, the wraparound gate structure 103b has an intermediate channel length, the wraparound gate structure 103c has the largest channel length and the wraparound gate structure 103d has the smallest channel length. The remaining features are similar to the structure shown in FIG. 1.

Figure 3:
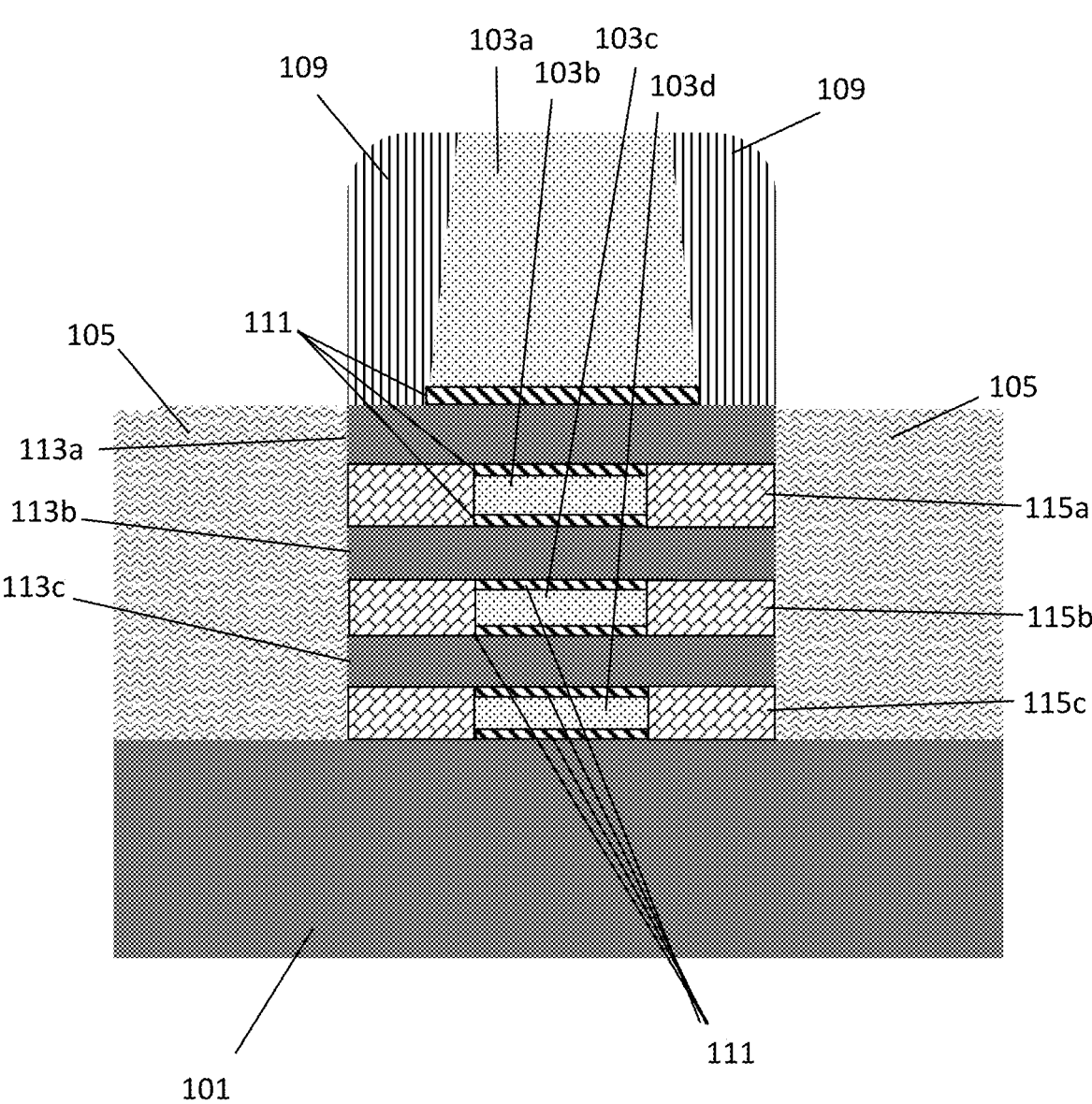
FIG. 3 shows a cross-sectional view of a nanosheet FET in accordance with further aspects of the present disclosure.

FIG. 3 shows a cross-sectional view of a nanosheet FET in accordance with further aspects of the present disclosure. In FIG. 3, the FET 300 shows another configuration of the wraparound gate structures 103b, 103c, 103d and respective inner sidewall spacers 115a-115c. In this example, the channel lengths of the wraparound gate structures 103b, 103c, 103d and the thicknesses of the inner sidewall spacers 115a-115c are respectively the same. The remaining features are similar to the structure shown in FIG. 1.

FIGS. 4A, 4B, 4C, 4D, 4E, 4F, 4G, 4H, and 4I show cross-sectional views of respective fabrication processes of a nanosheet FET in accordance with aspects of the present disclosure. For example, in FIG. 4A, a beginning structure is provided. The beginning structure includes a dummy gate structure 403 with sidewall spacer 109 over a topmost nanosheet 113a of a stack of nanosheets 113a-113c. The material of the sidewall spacer 109 may also be provided over a top surface of the dummy gate structure 403, acting as a cap.

The stack of nanosheets 113a-113c may be spaced apart or interspersed by a sacrificial semiconductor material 415a-415c. In embodiments, the sacrificial semiconductor material 415a-415c may be composed of material that is selectively etchable with respect to the nanosheets 113a-113c. For example, the nanosheets 113a-113c may be Si material and the sacrificial semiconductor material 415a-415c may be SiGe material; although any selectively etchable materials may be used for the sacrificial semiconductor material 415a-415c. In embodiments, the dummy gate structure 403 may be polysilicon. A gate dielectric 111 may be formed under the dummy gate structure 403.

Figures 4A, 4B:
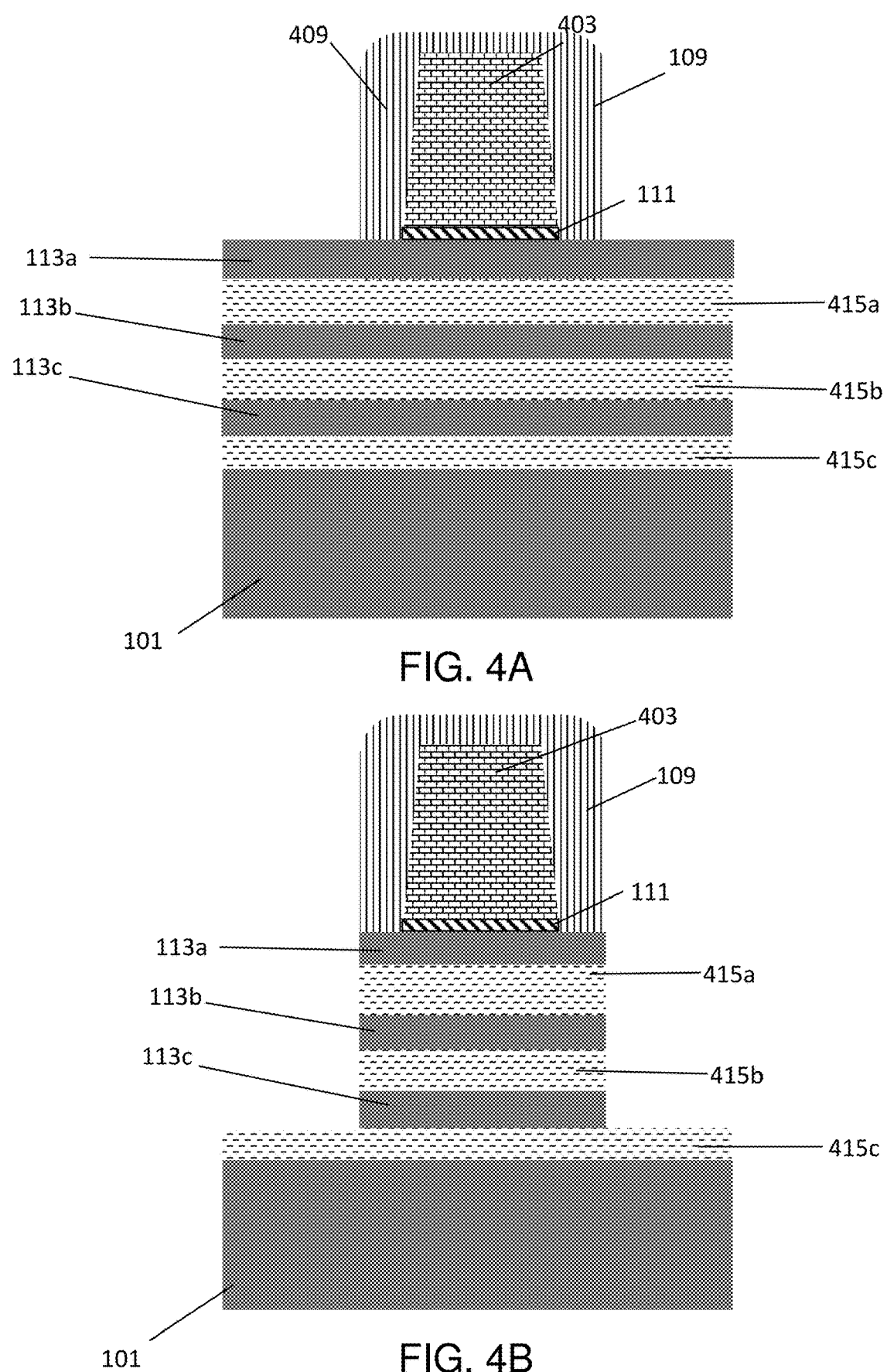
FIGS. 4A, 4B, 4C, 4D, 4E, 4F, 4G, 4H, and 4I show cross-sectional views of respective fabrication processes of a nanosheet FET in accordance with aspects of the present disclosure.

As further shown in FIG. 4A, the nanosheet structure includes three alternating layers of semiconductor nanosheets 113a-113c and sacrificial semiconductor nanosheets 415a-415c. In embodiments, more layers of semiconductor nanosheets 113a-113c and sacrificial semiconductor nanosheets 415a-415c are contemplated. Also, the alternating layers of semiconductor nanosheets 113a-113c and sacrificial semiconductor nanosheets 415a-415c may have a thickness of between 5 to 20 nanometers (nm), preferably between 5 to 15 nm.

Although not critical to the understanding of the present disclosure, the dummy gate structure 403 can be fabricated using conventional CMOS processes. For example, polysilicon material and gate dielectric material 111 may be deposited on the topmost nanosheet 113a by a conventional deposition process, e.g., chemical vapor deposition (CVD), followed by a patterning process. An insulator material such as nitride or oxide can be deposited on the patterned materials, followed by an anisotropic etching process to form the sidewall spacer 109. Additional insulator or capping material may be provided on the top surface of the dummy gate structure 403.

In FIG. 4B, the semiconductor nanosheets 113a-113c and sacrificial semiconductor nanosheets 415a, 415b are patterned, using the spacer material 109 as a mask. In this embodiment, the patterning is performed by a conventional timed RIE process, leaving the sacrificial semiconductor nanosheet 415c intact on the semiconductor substrate 101.

The sidewall spacer 109 protects the dummy gate structure 403 and provides for the final dimensions of the patterned semiconductor nanosheets 113a-113c and sacrificial semiconductor nanosheets 415a-415b.

Figures 4C, 4D:
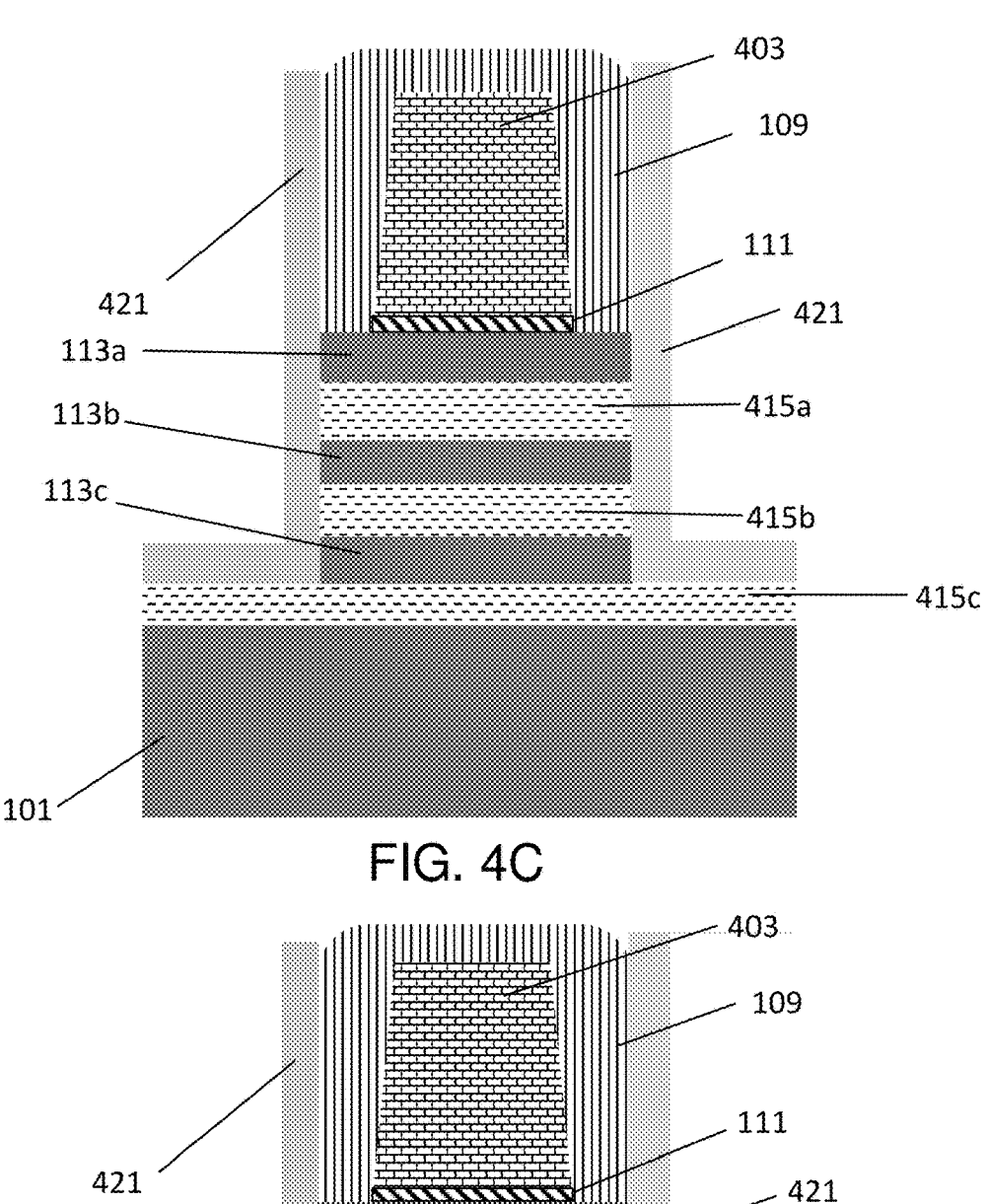

Referring to FIG. 4C, a sacrificial spacer 421 may be deposited on the patterned semiconductor nanosheets 113a-113c and sacrificial semiconductor nanosheets 415a, 415b, in addition to a top surface of the sacrificial semiconductor nanosheet 415c and the dummy gate structure 403. In embodiments, the sacrificial spacer 421 can be an oxide material, nitride material or other sacrificial material.

In FIG. 4D, the sacrificial spacer 421 is removed from the top surface of the sacrificial semiconductor nanosheet 415c and the dummy gate structure 403. In embodiments, the removal process may be a conventional anisotropic etching process. As should be understood by those of skill in the art, the anisotropic etching process includes a lateral etching component that etches horizontal surfaces of the sacrificial spacer 421.

Figure 4E:
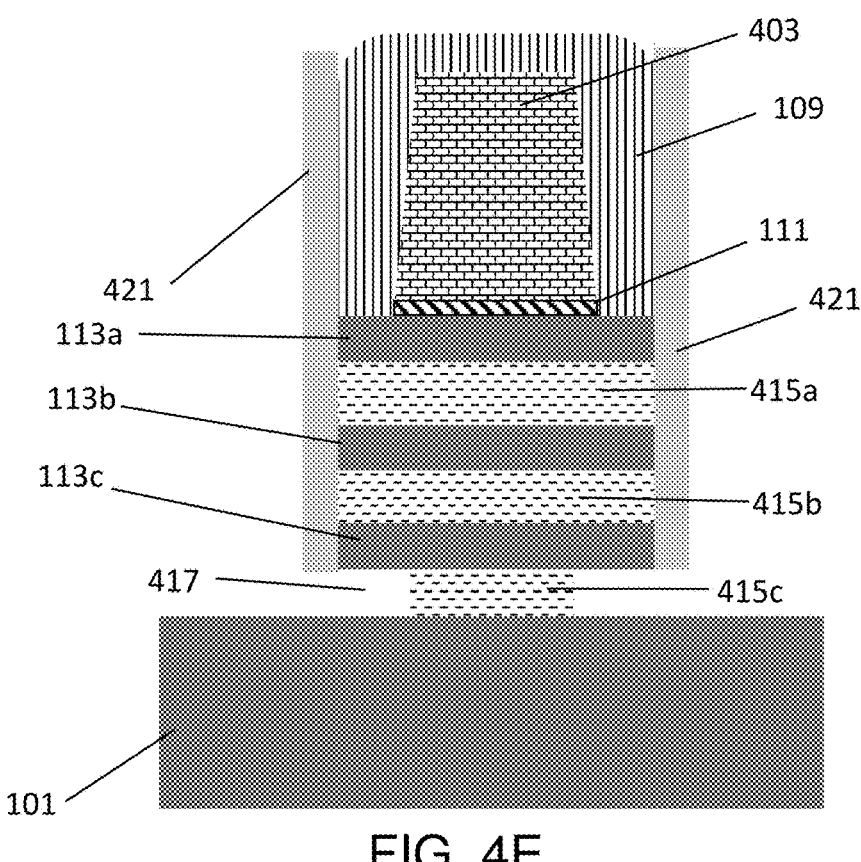

In FIG. 4E, the sacrificial nanosheet layer 415c is subjected to an isotropic etching process followed by an anisotropic etch back process to provide a recess 417 between the semiconductor substrate 101 and the nanosheet 113c. In embodiments, the etching process can be a selective etching process which only attacks, e.g., etches, the exposed sacrificial nanosheet layer 415c. For example, the selective etching process may be HCl chemistry. The sacrificial spacer 421 on the sidewalls of the remaining nanosheets 113b, 113a and the sacrificial semiconductor nanosheets 415a, 415b will also prevent etching of these layers.

Figure 4F:
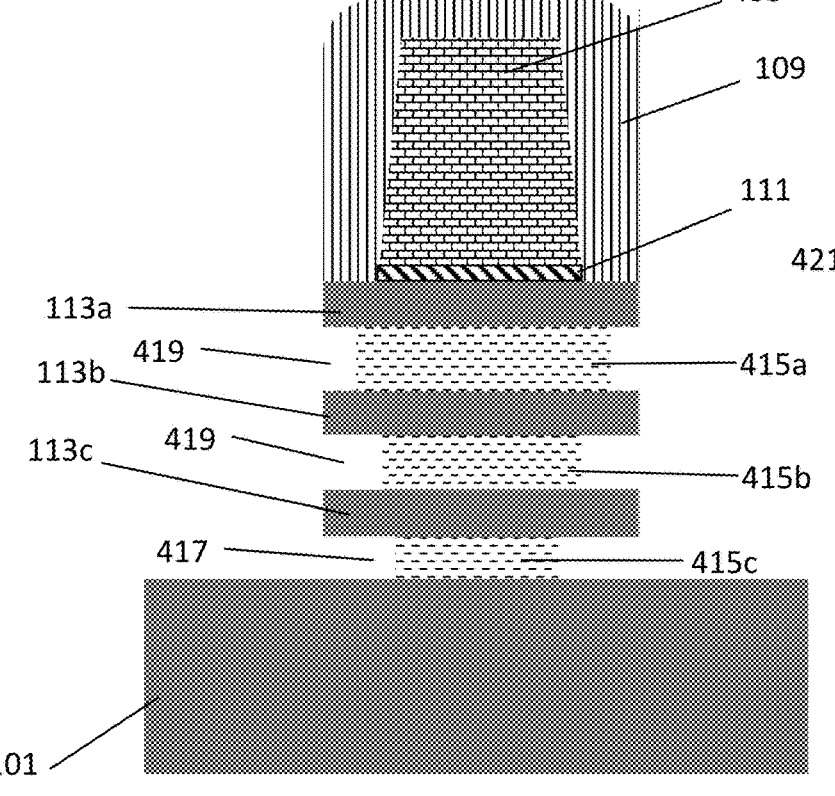

In FIG. 4F, the sacrificial spacer is removed to expose the nanosheets 113a-113c and the sacrificial semiconductor nanosheets 415a, 415b. The sacrificial spacer may be removed by any known etching process. Following the removal of the sacrificial spacer, a selective anisotropic etching process will be used to etch back the exposed sacrificial semiconductor nanosheets 415a and 415b to create additional recesses 419. In this etching process, the lower recess 417 may be further etched back resulting in a deeper depth of the recess. The selective etching process may also use HCl chemistry.

As should be understood by those of skill in the art, the depth of the recesses 417, 419 will correspond with a thickness of the inner sidewall spacers, e.g., a deeper depth will result in a thicker inner sidewall spacer. For example, the lower recess 417 will be deeper than the remaining recesses 419 due to being subjected to two etching processes, resulting in a thicker inner sidewall spacer than in the other recesses 419. In turn, the thickness of the inner sidewall spacers will result in different channel lengths, with a larger recess having a thicker inner sidewall spacer and, in turn, a shorter gate channel length.

In the embodiment of FIG. 4F, the additional recesses 419 may be the same size; however, it is also contemplated to create recesses of variable depths by, for example, etching a bottom portion of the sacrificial spacer to expose the sacrificial semiconductor nanosheet 415b prior to a further recess process. In this way, different etching processes can be used for each of the sacrificial semiconductor nanosheets 415b, 415c, with each successive etching process resulting in a lower, previously exposed recess becoming larger. Other alternatives are also possible in order to expose selected sacrificial semiconductor nanosheets to provide variable depths, e.g., tunable depths and, hence, tunable thicknesses of the inner sidewall spacers.

Figure 4G:
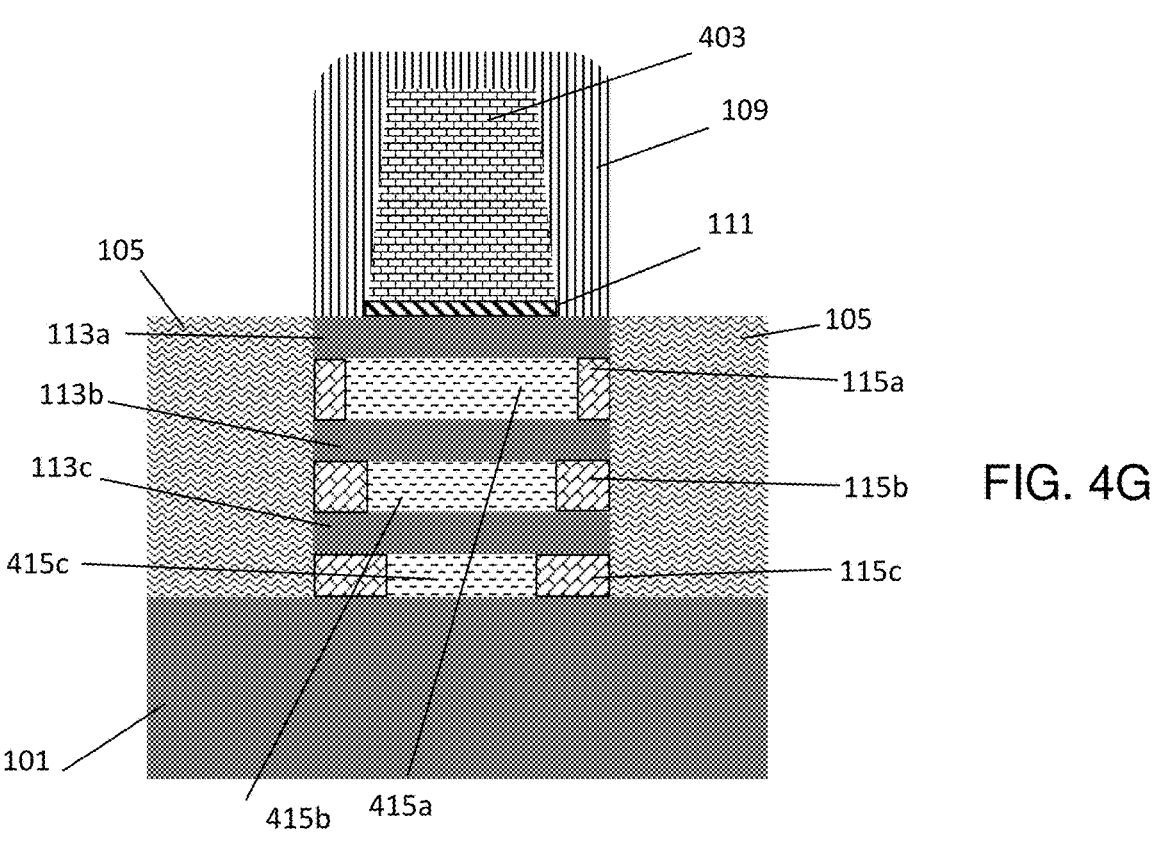

Referring to FIG. 4G, material forming the inner sidewall spacers 115a-115c may be deposited within the recesses

417, 419 using a conformal deposition process, e.g., a low pressure CVD process (LPCVD). In embodiments, the inner sidewall spacers 115a-115c may be SiN, SiOCN, SiOC or other insulator material designed to reduce parasitic capacitance between gate structures and the raised source/drain regions 105 formed by epitaxial growth processes as is known in the art. As shown in FIG. 4G, the inner sidewall spacers 115a-115c may have different thicknesses due to the different depths of the previously formed recesses 417 and 419.

Figure 4H:
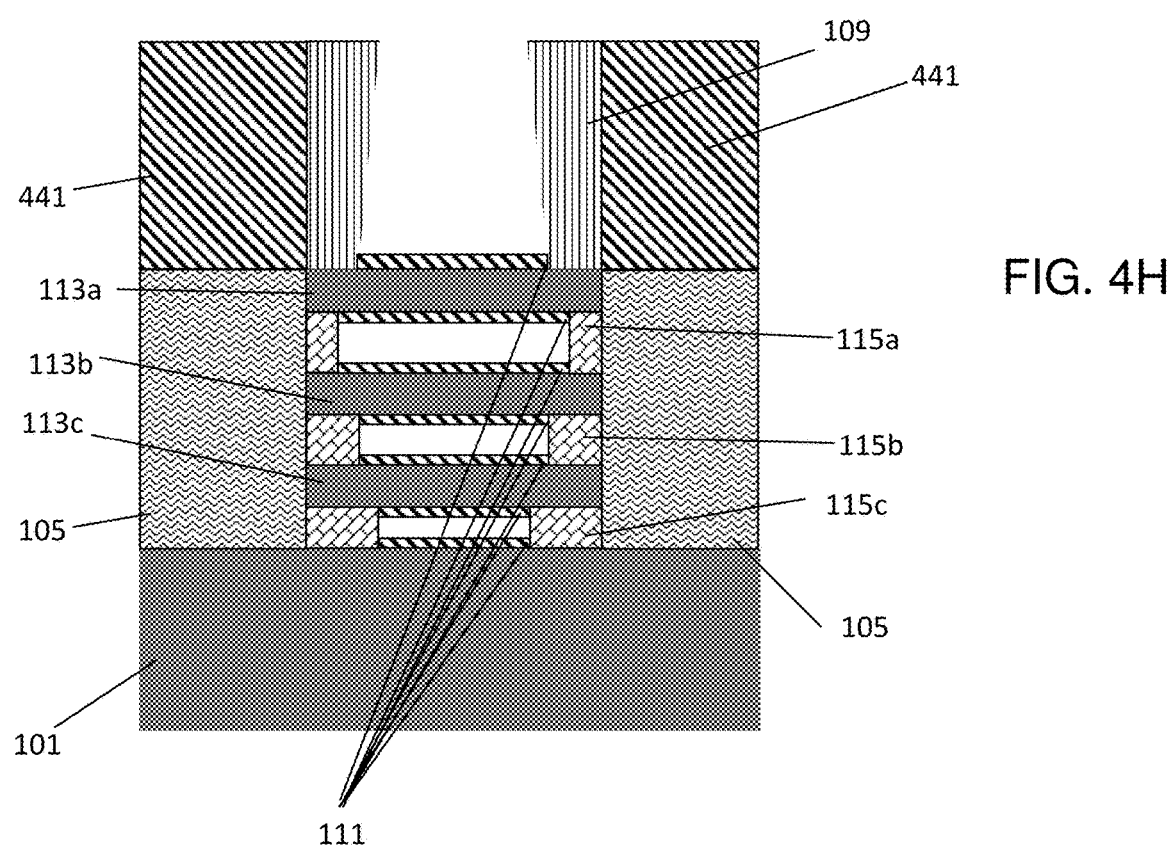

In FIG. 4H, the remaining portions of the sacrificial semiconductor nanosheets 415a-415c may be removed by a selective etch chemistry as already described herein. In addition, the dummy gate structure 403 may be removed. In embodiments, an interlevel dielectric material 441 may be deposited and planarized prior to the removal of the sacrificial semiconductor nanosheets 415a-415c and the dummy gate structure 403. In embodiments, the interlevel dielectric material 441 may be SiN, $SiO_2$ or combinations thereof.

For example, interlevel dielectric material 441 may be deposited by a conventional CVD process. Following the deposition process, the interlevel dielectric material 441 and the spacer material (e.g., cap) 109 over the dummy gate structure 403 may be planarized to expose the dummy gate structure 403. The dummy gate structure 403 may be removed (e.g., pulled out) by an etching process, with the interlevel dielectric material 441 protecting underlying structures, e.g., raised source/drain regions 105.

The sacrificial semiconductor nanosheets 415a-415c may also be removed by use of a selective etch chemistry so as to not attack the semiconductor nanosheets 115a-115c and the semiconductor substrate 101. The exposed surfaces of the semiconductor nanosheets 115a-115c may undergo a cleaning process to remove any sacrificial oxide material, as an example. The gate dielectric material 111 may be deposited on the inner sidewall spacers 115a-115c and the exposed surfaces of the semiconductor nanosheets 115a-115c.

Figure 4I:
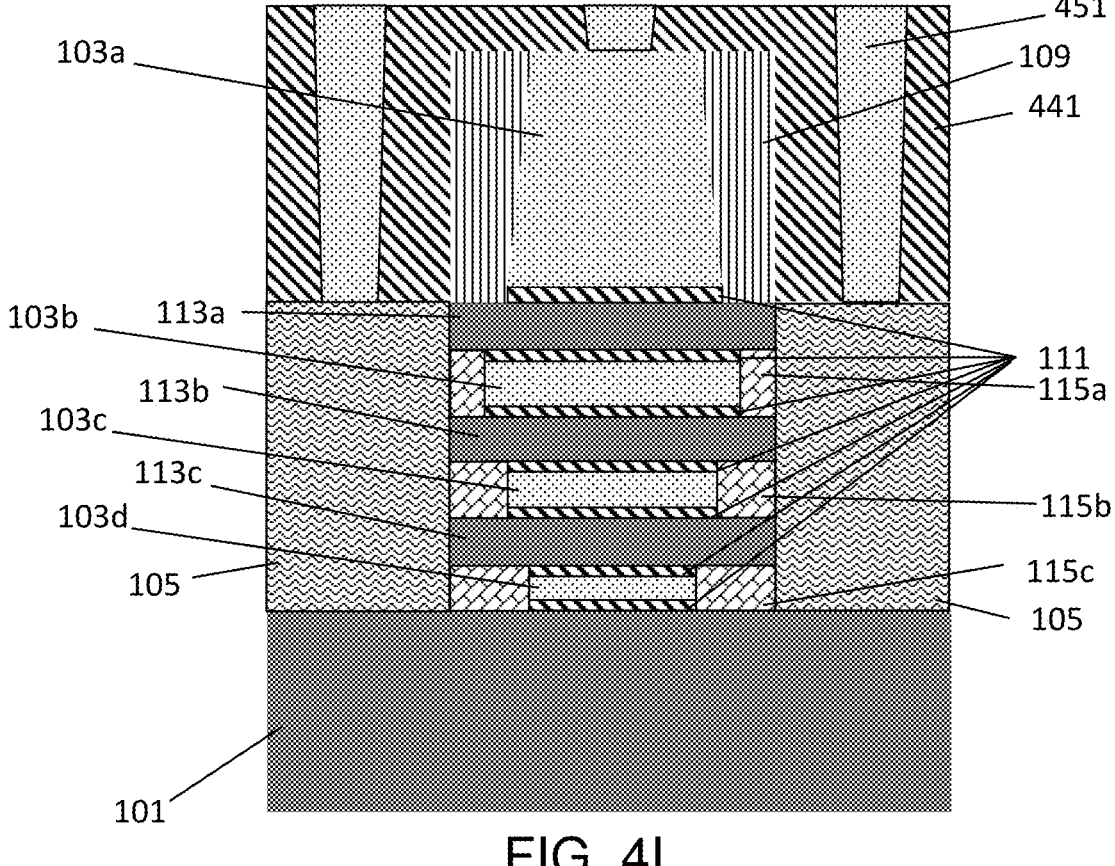

Referring to FIG. 4I, workfunction material 451 may be deposited on the gate dielectric material 111 at the regions in which the sacrificial semiconductor material was removed between the inner sidewall spacers 115a-115c. In embodiments, the workfunction material 451 may be used to form the gate structures 103a-103d. And, as should be understood by those of skill in the art, the gate lengths of the gate structures 103b-103d, e.g., wraparound gate structures, are now tuned based on the recessing process of FIG. 4F and subsequent deposition of the inner sidewall spacers 115a-115c of FIG. 4G. Examples of the workfunction materials for a p-channel FET include Ti, TiAlC, Al, TiAl, TaN, TiN, TiC and Co. Examples of the workfunction materials for an n-channel FET include TiN, TaN, TaAlC, TiC, TiAl, TaC, Co, Al, HfTi, TiSi, TaSi or TiAlC. The workfunction materials may be formed by CVD, physical vapor deposition (PVD) including sputtering, atomic layer deposition (ALD) or other suitable method.

Still referring to FIG. 4I, additional interlevel dielectric material 441 may be deposited over the gate structure 103a. Contacts 451 may be formed to the gate structure 103a and the raised source/drain regions 105. Prior to forming the contacts to the raised source/drain regions 105, a silicide process may be performed to form silicide contacts on the raised source/drain regions 105. Prior to the silicide process, vias or trenches are formed in the interlevel dielectric material 441 to expose portions of the raised source/drain regions 105.

The vias or trenches may be formed by conventional lithography and etching processes. For example, a resist formed over the interlevel dielectric material 441 is exposed to energy (light) and developed utilizing a conventional resist developer to form a pattern (opening). An etching process with a selective chemistry, e.g., RIE, will be used to transfer the pattern from the patterned photoresist layer to the interlevel dielectric material 441 to form one or more trenches in the interlevel dielectric material 441. Following the resist removal by a conventional oxygen ashing process or other known stripants, a silicide process may be performed.

As should be understood by those of skill in the art, the silicide process begins with deposition of a thin transition metal layer, e.g., nickel, cobalt or titanium, over fully formed and patterned semiconductor devices (e.g., source/drain regions). After deposition of the material, the structure is heated allowing the transition metal to react with exposed silicon (or other semiconductor material as described herein) in the active regions of the semiconductor device (e.g., source/drain region) forming a low-resistance transition metal silicide. Following the reaction, any remaining transition metal is removed by chemical etching, leaving silicide contacts in the active regions of the device. It should be understood by those of skill in the art that silicide contacts will not be required on the metal gate structures.

Following the silicide process, the contacts 451 may be formed by conventional deposition processes within the vias or trenches, followed by a planarization process (e.g., chemical mechanical planarization (CMP). In embodiments, the contacts 451 may be tungsten or other appropriate metal material, e.g., aluminum, copper, etc. A TiN or TaN liner may also be used prior to the deposition of the tungsten.

The structures can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a plurality of stacked semiconductor nanosheets over a semiconductor substrate;

a plurality of gate structures surrounding individual nanosheets of the plurality of stacked semiconductor nanosheets, with a lower gate structure comprising a length at least equal to a length of each remaining gate structure of the plurality of gate structures;

an inner sidewall spacer adjacent each of the plurality of gate structures, wherein a thickness of the inner sidewall spacers has an inverse relationship to lengths of the gate structures; and source/drain regions on opposing sides of the plurality of gate structures, separated therefrom by the inner sidewall spacer.

2. The structure of claim 1, wherein the length of the lower gate structure is less than the length of an uppermost gate structure of the plurality of gate structures.

3. The structure of claim 1, wherein the inner sidewall spacers surround each of the plurality of gate structures along the length.

4. The structure of claim 1, wherein the length of the lower gate structure is less than the length of any of the remaining gate structures of the plurality of gate structures.

5. The structure of claim 1, wherein a middle gate structure of the plurality of gate structures has a largest length, and wherein the gate structures comprise a bow shape profile which results in an inverse bow shape structure of the inner sidewall spacers.

6. The structure of claim 1, wherein the plurality of gate structures comprise wraparound gate structures.

7. The structure of claim 1, wherein the inner sidewall spacer for each of the plurality of gate structures has a different thickness.

8. The structure of claim 1, wherein the inner sidewall spacer for each of the plurality of gate structures has a same thickness.

9. The structure of claim 1, wherein the inner sidewall spacer for the lower gate structure has a thickness greater than the inner sidewall spacer for the each remaining gate structure of the plurality of gate structures.

10. The structure of claim 1, further comprising a top gate structure over an uppermost nanosheet of the plurality of stacked semiconductor nanosheets.

11. The structure of claim 1, wherein the plurality of stacked semiconductor nanosheets comprise Si material.

12. The structure of claim 1, wherein the source/drain regions comprise raised source/drain regions adjacent to each of the plurality of gate structures and a lowest gate structure of the plurality of gate structures is over the semiconductor substrate.

13. The structure of claim 1, wherein the plurality of gate structures comprise wraparound structures and the thickness of the inner sidewall spacers includes an inverse relationship to a channel length of the wraparound structures, with the lower gate structure having a shortest channel length and a thickest inner sidewall spacer and an uppermost gate structure having a larger channel length and a thinnest inner sidewall spacer.

14. The structure of claim 1, further comprising a sidewall spacer surrounding the top gate structure and the inner sidewall spacers.

15. A structure comprising:

a plurality of stacked semiconductor nanosheets;

a plurality of gate structures surrounding individual nanosheets of the plurality of stacked semiconductor nanosheets, the plurality of gate structures comprising an inverse tapered profile, and wherein the plurality of gate structures are vertically stacked wraparound gate structures;

inner sidewall spacers adjacent each of the plurality of gate structures, wherein a thickness of the inner sidewall spacers has an inverse relationship to lengths of the gate structures; and source/drain regions on opposing sides of the plurality of gate structures.

16. The structure of claim 15, wherein a lower gate structure of the plurality of gate structures comprises a gate length smaller than any upper gate structure of the plurality of gate structures.

17. The structure of claim 16, wherein a lower inner sidewall spacer associated with the lower gate structure comprises a thickness greater than any upper inner sidewall spacer of the inner sidewall spacers.

18. The structure of claim 15, wherein the inner sidewall spacers separate the source/drain regions from the plurality of gate structures.

19. The structure of claim 15, wherein the stacked semiconductor nanosheets comprise Si material.

20. A method comprising:

forming a plurality of stacked semiconductor nanosheets over a semiconductor substrate;

forming a plurality of gate structures surrounding individual nanosheets of the plurality of stacked semiconductor nanosheets, with a lower gate structure comprising a length at least equal to a length of each remaining gate structure of the plurality of gate structures, and wherein the plurality of gate structures are vertically stacked wraparound gate structures;

forming an inner sidewall spacer adjacent each of the plurality of gate structures, wherein the thickness of the inner sidewall spacers has an inverse relationship to the length of the gate structures; and forming source/drain regions on opposing sides of the plurality of gate structures, separated therefrom by the inner sidewall spacer.

* * * * *